United States Patent
Lo et al.

(10) Patent No.: US 8,692,367 B1
(45) Date of Patent: Apr. 8, 2014

(54) WAFER-LEVEL PACKAGED DEVICE HAVING SELF-ASSEMBLED RESILIENT LEADS

(71) Applicant: Maxim Integrated Products, Inc., San Jose, CA (US)

(72) Inventors: Chiung C. Lo, Campbell, CA (US); Arkadii V. Samoilov, Saratoga, CA (US); Reynante T. Alvarado, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/633,108

(22) Filed: Oct. 1, 2012

Related U.S. Application Data

(62) Division of application No. 12/707,239, filed on Feb. 17, 2010, now Pat. No. 8,278,748.

(51) Int. Cl.
*H01L 23/48* (2006.01)

(52) U.S. Cl.
USPC .......... 257/692; 257/690; 257/E21.599; 257/E23.06; 257/642; 257/674; 438/106; 438/123; 438/14; 438/17; 438/780

(58) Field of Classification Search
USPC ............ 257/690–692, E21.599, E23.06, 257/642–643, 674; 438/106–123, 14–17, 438/461, 464, 422, 780–781
See application file for complete search history.

(56) References Cited

U.S. PATENT DOCUMENTS

| | | | |
|---|---|---|---|
| 3,924,915 | A | 12/1975 | Conrad |
| 4,189,342 | A | 2/1980 | Kock |
| 4,553,192 | A | 11/1985 | Babuka et al. |
| 4,893,172 | A | 1/1990 | Matsumoto et al. |
| 5,613,861 | A | 3/1997 | Smith et al. |
| 5,628,635 | A | 5/1997 | Ikeya |
| 5,763,941 | A | 6/1998 | Fjelstad |
| 5,832,601 | A | 11/1998 | Eldridge et al. |
| 5,904,498 | A | 5/1999 | Fjelstad |
| 5,913,109 | A | 6/1999 | Distefano et al. |
| 5,925,931 | A * | 7/1999 | Yamamoto ................... 257/737 |
| 6,080,603 | A | 6/2000 | Distefano et al. |
| 6,150,717 | A | 11/2000 | Wood et al. |

(Continued)

OTHER PUBLICATIONS

Bahr, Muhannad S., et al., Sea of Leads (SoL) Ultrahigh Density Wafer-Level Chip Input/Output Interconnections for Gigascale Integration (GSI), IEEE Transactions on Electron Devices, Oct. 2003, pp. 2039-2048, vol. 50, No. 10.

(Continued)

*Primary Examiner* — Alexander Sofocleous
*Assistant Examiner* — Ankush Singal
(74) *Attorney, Agent, or Firm* — Advent, LLP

(57) ABSTRACT

A wafer-level packaged semiconductor device is described. In an implementation, the device includes one or more self-assembled resilient leads disposed on an integrated circuit chip. Each of the resilient leads are configured to move from a first position wherein the resilient lead is held adjacent to the chip and a second position wherein the resilient lead is extended away from the chip to interconnect the chip to a printed circuit board. A guard is provided to protect the resilient leads when the resilient leads are in the first position. One or more attachment bumps may also be furnished to facilitate attachment of the device to the printed circuit board.

7 Claims, 15 Drawing Sheets

(56) References Cited

U.S. PATENT DOCUMENTS

| | | | |
|---|---|---|---|
| 6,184,576 B1 | 2/2001 | Jones et al. | |
| 6,221,750 B1 * | 4/2001 | Fjelstad | 438/611 |
| 6,224,396 B1 | 5/2001 | Chan et al. | |
| 6,268,015 B1 | 7/2001 | Mathieu et al. | |
| 6,307,260 B1 | 10/2001 | Smith et al. | |
| 6,307,392 B1 | 10/2001 | Soejima et al. | |
| 6,333,207 B1 | 12/2001 | Light et al. | |
| 6,405,429 B1 | 6/2002 | Slemmons et al. | |
| 6,472,305 B1 | 10/2002 | Ozaki et al. | |
| 6,525,555 B1 * | 2/2003 | Khandros et al. | 324/750.07 |
| 6,528,349 B1 | 3/2003 | Patel et al. | |
| 6,543,087 B2 | 4/2003 | Yeh et al. | |
| 6,560,861 B2 * | 5/2003 | Fork et al. | 29/842 |
| 6,672,875 B1 | 1/2004 | Mathieu et al. | |
| 6,680,536 B2 | 1/2004 | Hattori et al. | |
| 6,690,081 B2 | 2/2004 | Bakir et al. | |
| 6,696,754 B2 | 2/2004 | Sato et al. | |
| 6,778,406 B2 | 8/2004 | Eldridge et al. | |
| 6,806,570 B1 * | 10/2004 | Lee et al. | 257/737 |
| 6,808,958 B2 | 10/2004 | Light | |
| 6,876,212 B2 | 4/2005 | Fjelstad | |
| 6,888,256 B2 | 5/2005 | Hedler et al. | |
| 6,900,110 B1 | 5/2005 | Takiar et al. | |
| 6,948,940 B2 | 9/2005 | Lindsey et al. | |
| 6,998,718 B2 * | 2/2006 | Chang et al. | 257/781 |
| 7,048,548 B2 * | 5/2006 | Mathieu et al. | 439/66 |
| 7,141,885 B2 | 11/2006 | Kim | |
| 7,244,125 B2 | 7/2007 | Brown et al. | |
| 7,256,592 B2 | 8/2007 | Hosaka et al. | |
| 7,316,572 B2 | 1/2008 | Bernier et al. | |
| 7,435,108 B1 * | 10/2008 | Eldridge et al. | 439/81 |
| 7,555,836 B2 * | 7/2009 | Mathieu et al. | 29/876 |
| 7,621,045 B2 | 11/2009 | Hosaka et al. | |
| 7,674,112 B2 * | 3/2010 | Gritters et al. | 439/66 |
| 7,724,010 B2 | 5/2010 | Khoo et al. | |
| 7,989,945 B2 * | 8/2011 | Williams et al. | 257/692 |
| 2002/0031905 A1 * | 3/2002 | Beroz | 438/617 |
| 2002/0127768 A1 * | 9/2002 | Badir et al. | 438/106 |
| 2002/0142509 A1 | 10/2002 | Hattori et al. | |
| 2002/0142516 A1 | 10/2002 | Light | |
| 2002/0145182 A1 | 10/2002 | Smith et al. | |
| 2002/0170290 A1 | 11/2002 | Bright et al. | |
| 2003/0075358 A1 | 4/2003 | Smith et al. | |
| 2004/0072452 A1 | 4/2004 | Eldridge et al. | |
| 2005/0064626 A1 | 3/2005 | Light et al. | |
| 2007/0124932 A1 * | 6/2007 | Hosaka et al. | 29/874 |
| 2008/0074132 A1 * | 3/2008 | Fan et al. | 324/762 |
| 2009/0309098 A1 * | 12/2009 | Balucani | 257/48 |
| 2010/0001355 A1 * | 1/2010 | Peczalski et al. | 257/415 |
| 2011/0089546 A1 | 4/2011 | Bayan | |

OTHER PUBLICATIONS

Bulcke, M. Vanden, et al., Introducing a Silicone Under the Bump Configuration for Stress Relief in a Wafer Level Packace, Electronics Packaging Technology Conference, 2003, pp. 380-384.

Dang, Bing, et al., Sea-of-Leads MEMS I/O Interconnects for Low-k IC Packging, Journal of Microelectromechanical Systems, Jun. 2006, pp. 523-530. vol. 15, No. 3.

Dudek, Rainer, et al., Thermo-mechanical Design for Reliability of WLPs With Compliant Interconnects, Electronics Packaging Technology Conference, 2005, pp. 328-334.

Gao, Guilian, et al., Compliant Wafer Level Package for Enhanced Reliability, IEEE, 2007, pp. 1-5.

Harsh, Kevin, et al., Solder Self-Alignment for Optical Mems, IEEE, 1999, pp. 860-861.

Kacker, Karan, et al., Low-K Dielectric Compatible Wafer-Level Compliant Chip-to-Substrate Interconnects, IEEE Transactions on Advanced Packaging, Feb. 2008, vol. 31, No. 1.

Keser, Beth, et al., Encapsulated Double-Bump WL-CSP: Design and Reliability, Electronic Components and Technology Conference, 2001, pp. 1-5.

Syms, Richard R. A., Surface Tension Powered Self-Assembly of 3-D Micro-Optomechanical Structures, Journal of Microelectromechanical Systems, Dec. 1999, pp. 448-455, vol. 8, No. 4, IEEE.

* cited by examiner

US 8,692,367 B1

WAFER-LEVEL PACKAGED DEVICE HAVING SELF-ASSEMBLED RESILIENT LEADS

CROSS-REFERENCE TO RELATED APPLICATIONS

This application is a Divisional under 35 U.S.C. §120 of U.S. patent application Ser. No. 12/707,239 filed Feb. 17, 2010, entitled "WAFER-LEVEL PACKAGED DEVICE HAVING SELF-ASSEMBLED RESILIENT LEADS," which is hereby incorporated by reference in its entirety.

BACKGROUND

Traditional fabrication processes used in the manufacture of semiconductor devices employ microlithography to pattern integrated circuits onto a circular wafer formed of a semiconductor such as silicon, or the like. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging is an emerging chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

A wafer-level packaged device is described. In an implementation, the device includes one or more self-assembled resilient leads disposed on an integrated circuit chip. Each of the resilient leads are configured to move from a first position wherein the resilient lead is held adjacent to the chip and a second position wherein the resilient lead is extended away from the chip to interconnect the chip to a printed circuit board. A guard is provided to protect the resilient leads when the resilient leads are in the first position. In one or more embodiments, attachment bumps may also be furnished on the integrated circuit chip to facilitate attachment of the device to the printed circuit board.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
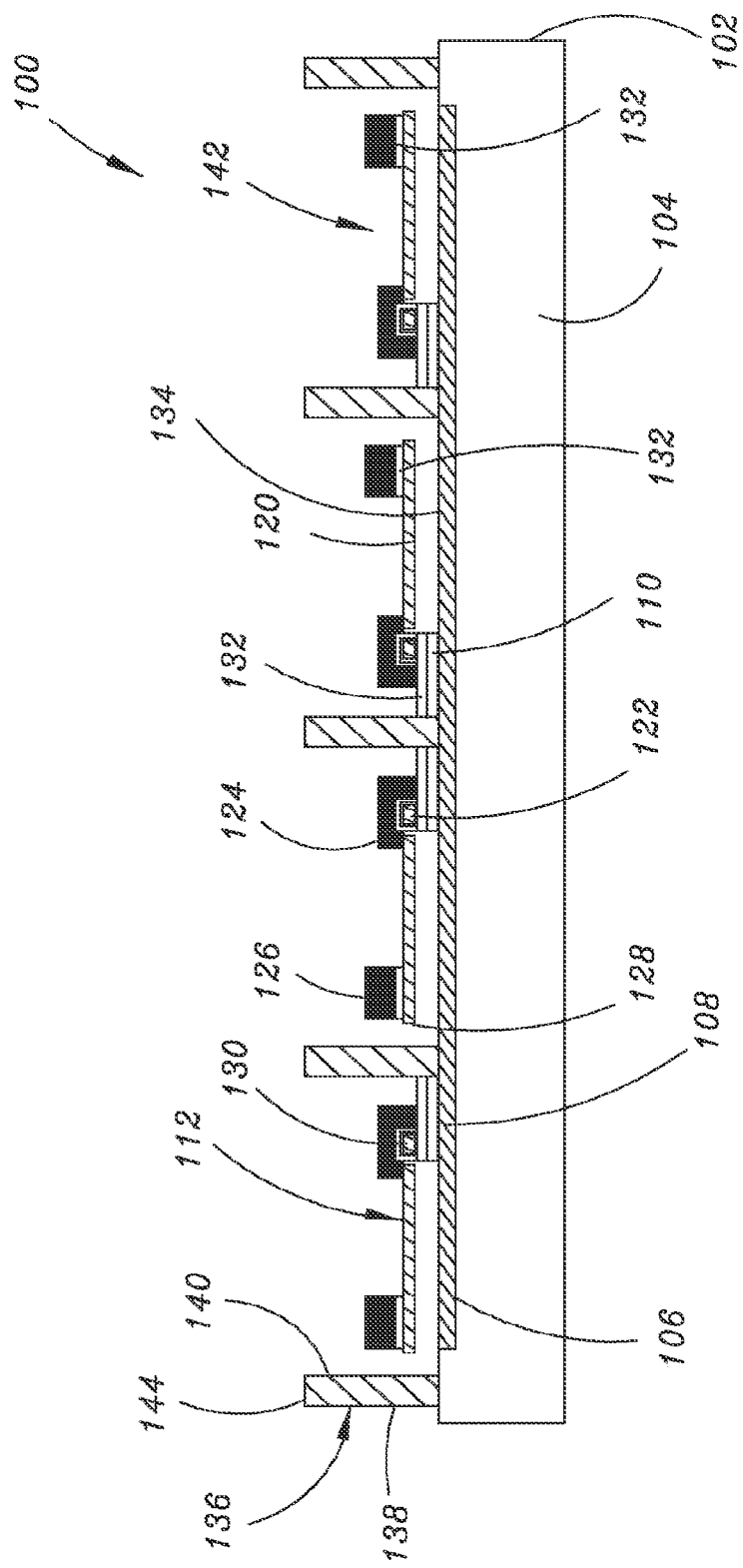
FIG. 1 is a diagrammatic partial cross-sectional side elevation view illustrating a wafer-level packaged device having self-assembled resilient leads in accordance with an example implementation of the present disclosure.

Wafer-level packaging facilitates the production of semiconductor devices that are lower in cost, have smaller form factors, and provide lower parasitic effects than devices manufactured utilizing many other packaging technologies. However, the application of wafer-level packaging techniques has heretofore been limited to use in the production of devices using small integrated circuit chips (e.g., devices with dies having a surface area of less than about 25 mm$^2$). For devices employing larger chips, the mismatch of the coefficient of thermal expansion (CTE) between the chip and the printed circuit board (FR4) to which the device is mounted becomes significant. During thermal cycling tests, this mismatch can cause high stress and cracks in bumps (solder balls) used to mount the device to the printed circuit board. In addition, during drop tests, the relatively high stiffness of solder may cause stress to occur at the interface between the solder ball and the inter-metallic compounds of the bump.

Accordingly, techniques are described for fabricating wafer-level packaged semiconductor devices having resilient leads configured to absorb stresses caused by CTE mismatch during thermal cycling tests and/or dynamic deformation during drop tests. The resilient leads facilitate the fabrication of wafer-level packaged devices that employ large integrated circuit chips (e.g., devices that employ dies having a surface area of greater than about 25 mm$^2$). In one or more implementations, the resilient leads are further configured to be self-assembled. More specifically, during high temperature assembly reflow, the resilient leads are configured to move from a first position wherein the resilient leads are held adjacent to (e.g., generally parallel with) the face of the integrated circuit chip and a second position wherein ends of the resilient leads are extended away from the chip to electrically interconnect the chip to a printed circuit board. A guard disposed on the integrated circuit chip protects the resilient leads when the resilient leads are in the first position, such as during fabrication (e.g., during wafer backgrinding and segmentation) and/or during assembly of the device to the printed circuit board. The guard may also provide for mechanical attachment of the device to the printed circuit board during and/or after assembly. Tape support and protection (e.g., backgrind tape) may be applied to the guard to form a pocket that encloses the resilient leads to further protect the resilient leads during fabrication (e.g., during wafer backgrinding and segmentation). In one or more embodiments, attachment bumps may be furnished to provide additional mechanical and/or electrical attachment of the device to the printed circuit board.

Example Implementations

FIGS. 1 through 6 illustrate wafer-level packaged semiconductor devices 100 having self-assembled resilient leads in example implementations of the present disclosure. The devices 100 shown include an integrated circuit chip 102 comprised of a substrate 104 and one or more integrated circuits 106 formed in a surface 108 of the substrate 104. One or more bonding pads 110 are electrically coupled to the integrated circuit 106. The bonding pads 110 provide electrical contacts through which the integrated circuit 106 may be interconnected to external components as described in more detail below. In one or more embodiments, the bonding pads 110 may be redistribution layer (RDL) pads interconnected with the integrated circuit 106 via a redistribution structure as described in more detail herein below. The number and configuration of bonding pads 110 provided may vary depending on the complexity and configuration of the integrated circuit 106, the size and shape of the integrated circuit chip 102, and so forth.

In accordance with the present disclosure, one or more resilient leads 112 are formed on the integrated circuit chip 102. The resilient leads 112 are configured to furnish electrical interconnection between the bonding pads 110 of the integrated circuit 106 and corresponding pads 114 formed on the surface 116 of a printed circuit board 118. As shown, each of the resilient leads 112 includes a lead member 120 formed as a thin, elongated plate that is configured to flex without breaking to absorb stresses that may result from CTE mismatch and dynamic deformation. The lead member 120 is fabricated using conductive materials to provide low resistance electrical interconnection between the bonding pad 110 of the integrated circuit 106 to which it is attached and a corresponding pad 114 of the printed circuit board 118. Example materials that may be used for fabrication of the lead members 120 include metals (e.g., aluminum), metalized polymers, laminate materials including one or more metal or metalized layers, and on.

A first end 122 of the lead member 120 is coupled to a bonding pad 110 of the integrated circuit chip 102 by a first μbump 124. A second μbump 126 is provided at the second end 128 of the lead member 120 on the outer surface of the lead member 120. In one or more embodiments, the μbumps 124,126 may be formed of solder. However, it is contemplated that the μbumps 124,126 may be formed of other conductive substances such as metals (e.g., aluminum) that will melt and flow at temperatures encountered during a high temperature reflow process at assembly (e.g., approximately 220 C). The first and second μbumps 124, 126 may include under bump metallization (UBM) 132 to provide a reliable interconnect interface. In one or more embodiments, the under bump metallization (UBM) 132 may be configured (e.g., shaped) to compensate for the cantilever (e.g., pivoting) action of the lead member 120. Example processes that may be used to form the resilient leads 112 using wafer-level packaging techniques are described in more detail below.

The lead member 120 may pivot about a micro-hinge assembly 130 encapsulated within the first μbump 124. Prior to assembly, the lead member 120 is held adjacent to the integrated circuit chip 102 by the first μbump 124. In the implementations illustrated, the first μbump 124 is shown as being configured to hold the lead member 120 in a cantilevered position, generally parallel to, but spaced apart from the face 134 of the integrated circuit chip 102 so that the second μbump 126 faces away from integrated circuit chip 102. However, other configurations are possible.

A guard 136 is provided on the face 134 of the integrated circuit chip 102 to shield the resilient leads 112 against damage during fabrication of the device 100 (e.g., during wafer backgrinding and segmentation) and/or during assembly of the device 100 to the printed circuit board 118. As shown, the guard 136 encircles the resilient leads 112, providing a wall structure 138 having pockets 142 in which the resilient leads 112 are contained. In embodiments, the height ($H_G$) of the wall structure 138 above the face 134 of the integrated circuit chip 102 is greater than the height of the resilient leads 112 (HO in the first (unassembled) position shown in FIGS. 2A and 5A, but equal to or less than the height of the resilient leads 112 ($H_{L2}$) in the second (assembled) position shown in FIGS. 2B and 5B.

The guard 136 may be fabricated of a thick polymer 140 applied to the face 134 of the integrated circuit chip 102 as described in more detail below. For instance, in one embodiment, the polymer 140 may have a thickness of about 100 μm, so that the height $H_G$ of the wall structure 138 is on the order of 100 μm, while the first and second μbumps 124, 126 may have a diameter of about 50 μm, so that the height of the resilient leads $H_u$ is on the order of about 50 μm in the unassembled position. In this embodiment, the lead member 120 may have a length greater than 100 μm so that the resilient lead 112 may extend beyond the guard 136 in the second (assembled) position. Example processes that may be used to form the guard 136 using wafer-level packaging techniques are described in more detail below.

Tape support and protection may be applied to the guard 136, as described herein below, to enclose the resilient leads 112 within the pockets 142. The tape support and protection prevents contaminants such as water, harsh chemicals, debris, and the like, from entering the pocket 142 during fabrication of the device 100 (e.g., during backgrinding and/or singulation). In embodiments, the tape support and protection may comprise a backgrind tape. However, it is contemplated that other tapes may be applied.

Figure 2A:
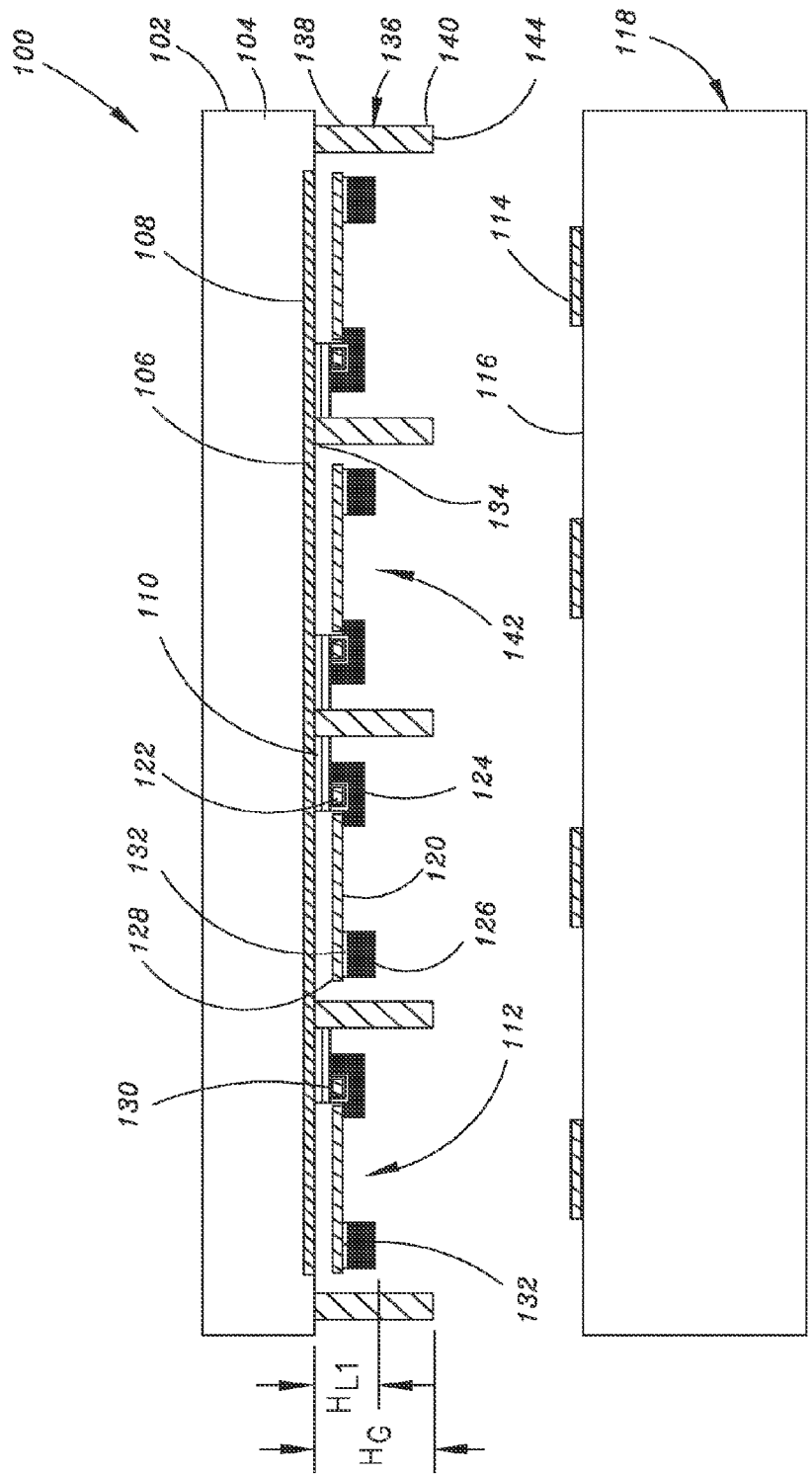
FIGS. 2A and 2B are diagrammatic partial cross-sectional side elevation views illustrating assembly of the wafer-level packaged device shown in FIG. 1 to a printed circuit board.
Figure 4:
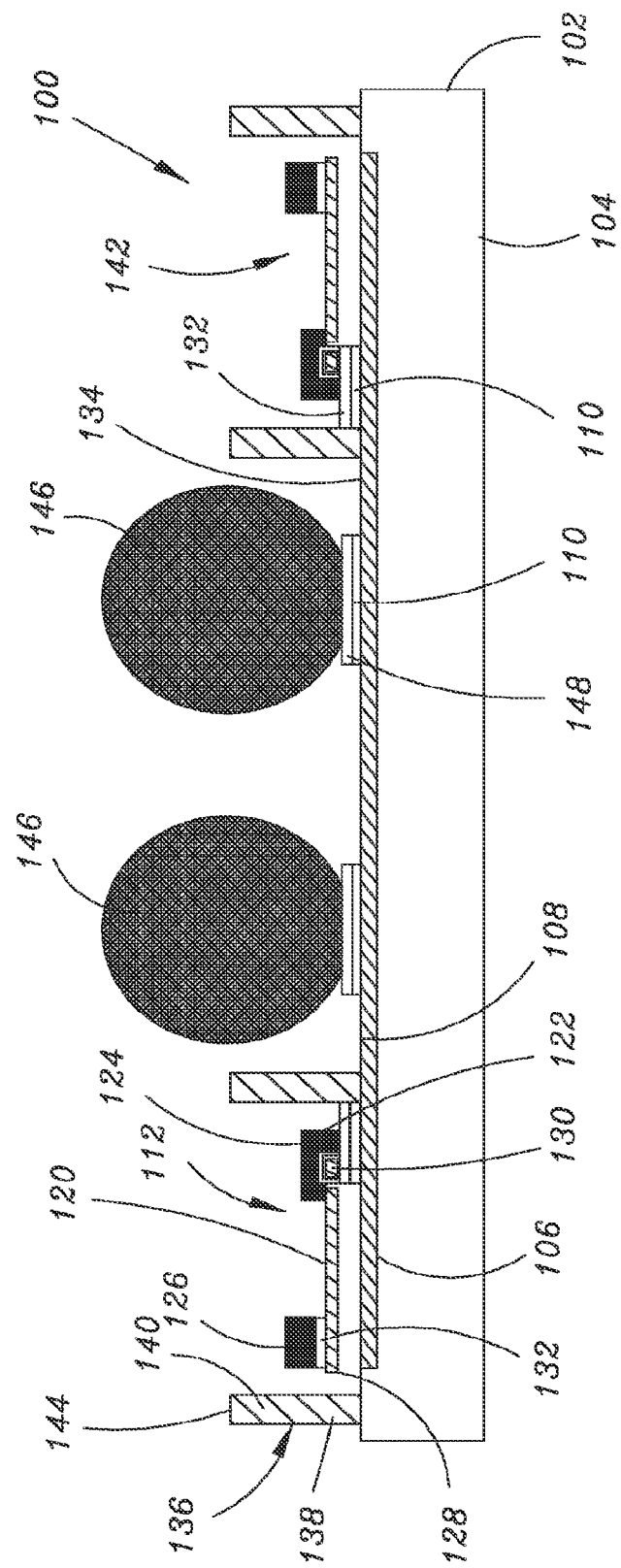
FIG. 4 is a diagrammatic partial cross-sectional side elevation view illustrating a wafer-level packaged device having self-assembled resilient leads and attachment bumps in accordance with another example implementation of the present disclosure.
Figure 5A:
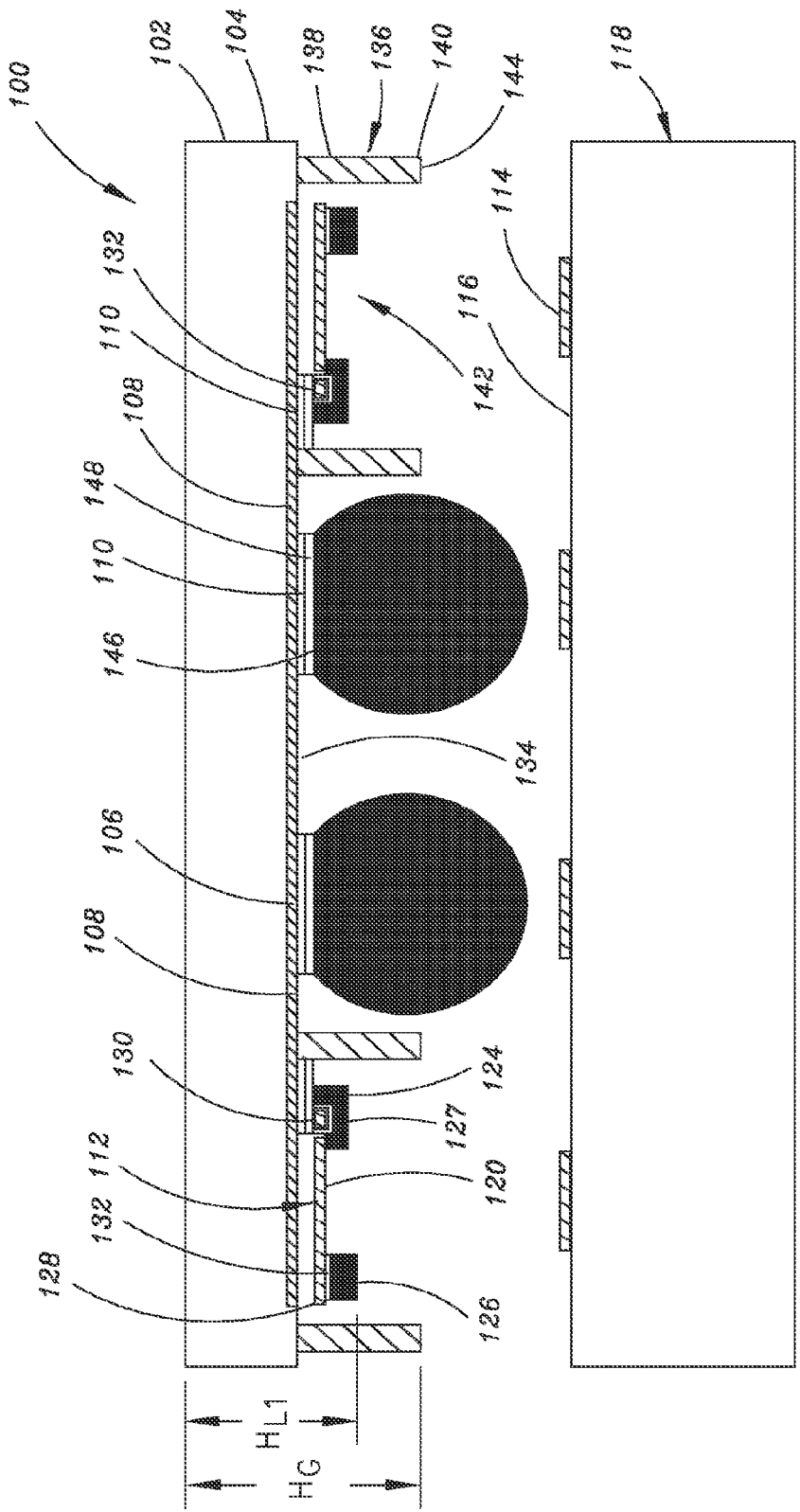
FIGS. 5A and 5B are diagrammatic partial cross-sectional side elevation views illustrating assembly of the wafer-level packaged device shown in FIG. 4 to a printed circuit board.

FIGS. 2A and 2B and 5A and 5B illustrate assembly of the devices 100 shown in FIGS. 1 and 4, respectively, onto printed circuit boards 118. In FIGS. 2A and 5A, each device 100 is shown flipped and positioned so that the resilient leads 112 are located over corresponding pads 114 of the printed circuit boards 118. The resilient leads 112 are shown in the first (unassembled) position, wherein the leads 112 are held generally adjacent to (and parallel with) the face 134 of the integrated circuit chip 102. As shown, the resilient leads 112 remain protected within the pockets 142 formed by the guard 136.

During assembly, a high temperature reflow process is applied to the device 100 and printed circuit board 118. This assembly reflow process heats the device 100 and causes the first and second µbumps 124, 126 of the resilient leads 112 to melt. When the first µbump 124 melts, surface tension is generated within the surface of the µbump 124. This surface tension applies torque to the lead member 120, causing the second end 128 of the lead member 120 to pivot about the first end 122, away from the face 134 of the integrated circuit chip 102, toward the printed circuit board 118. In some implementations, the weight of the second µbump 126 and lead member 120 may apply additional torque to the lead member 120. This torque may act in conjunction with the torque applied by surface tension in the first µbump 124 to cause rotation of the lead member 120.

Figure 2B:
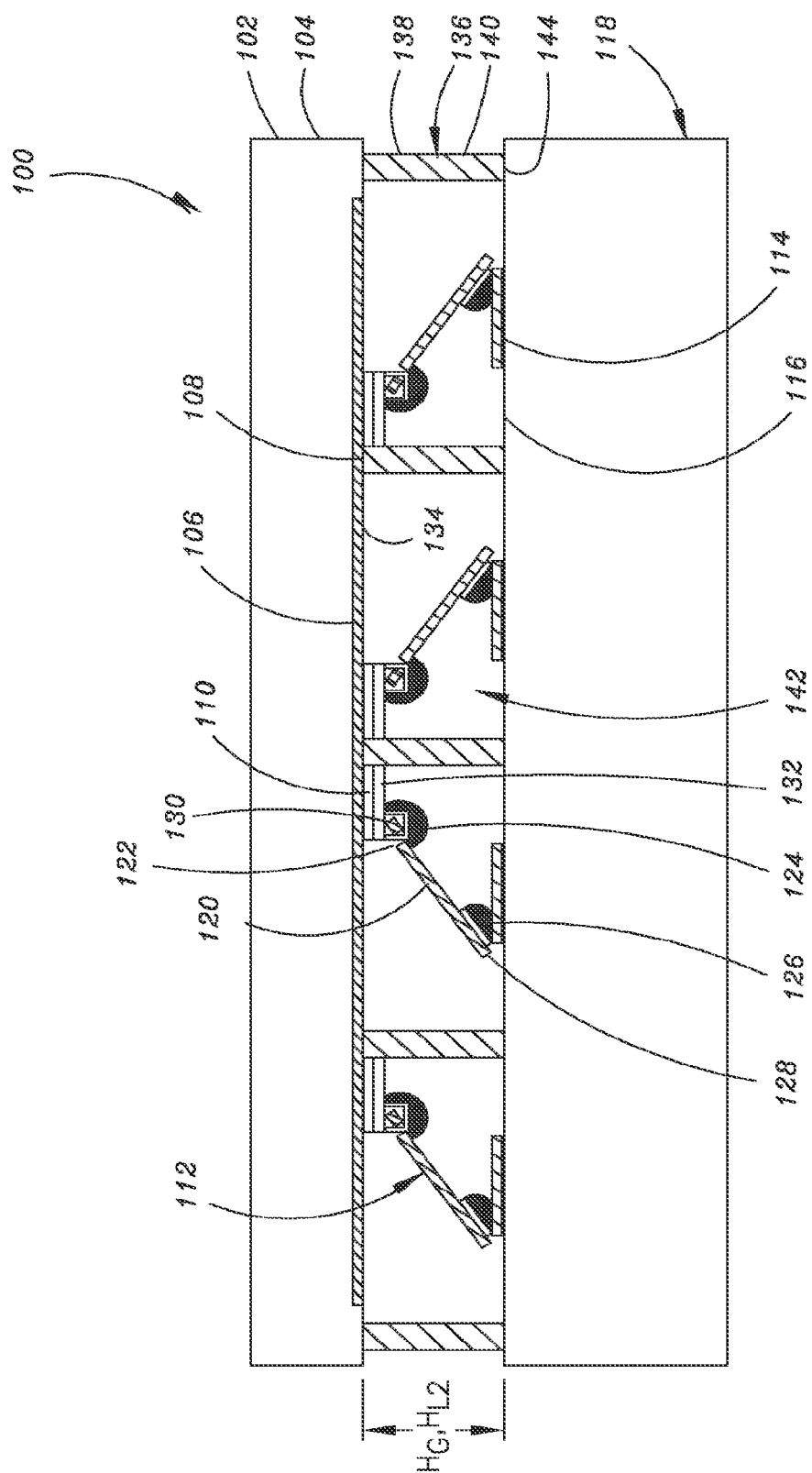
Figure 5B:
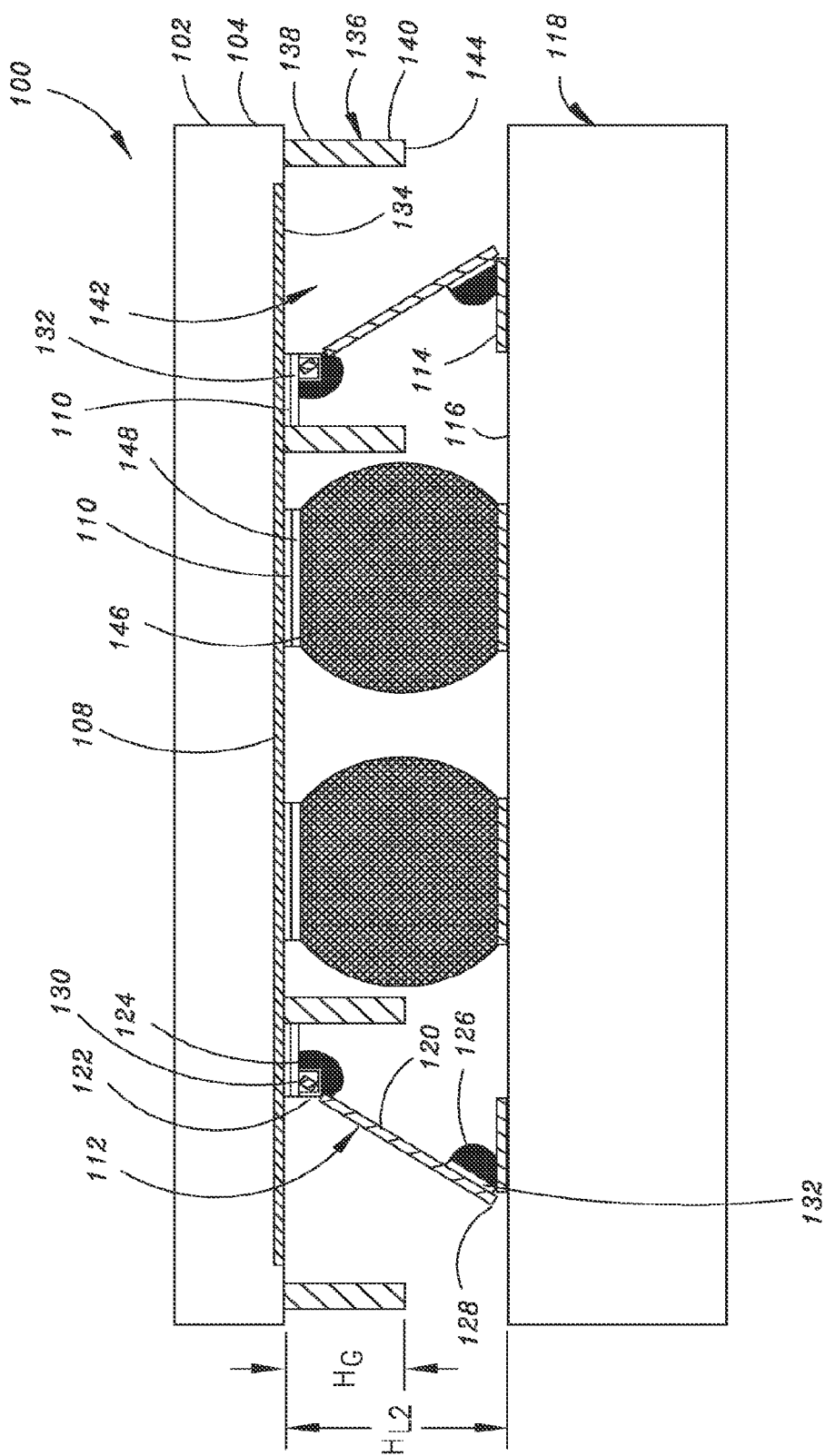

In the second (assembled) position, shown in FIGS. 2B and 5B, the lead member 120 is rotated until its second end 128 is adjacent to (e.g., in contact with) a corresponding pad 114 of the printed circuit board 118. The second µbump 126, which is melted due to the heat applied during the assembly reflow process, reflows along the outer surface of the lead member 120 and at least partially onto the pad 114. Surface tension generated in the surface of the second µbump 126 may pull the second end 128 of the lead member 120 to the pad 114 to hold the second end of the lead member 120 against the pad 114. The first and second µbumps 124, 126 are then cooled, so that the µbumps 124, 126 solidify, securing the lead member 120 in place.

Figure 3:
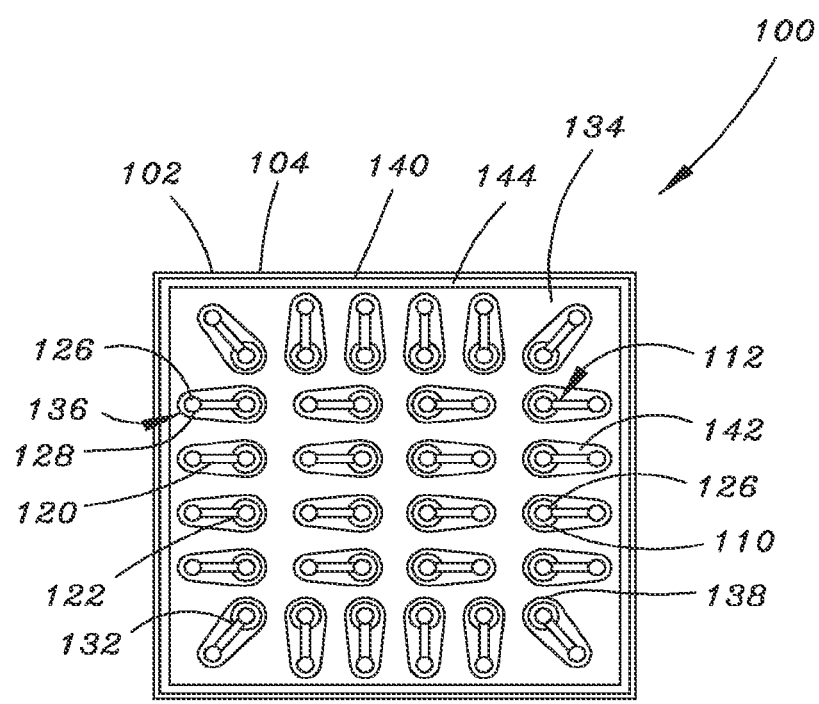
FIG. 3 is a diagrammatic top plan view of the wafer-level packaged device shown in FIG. 1.

In the implementation shown in FIGS. 1 through 3, the guard 136 contacts the surface 116 of the printed circuit board 118 when the device 100 is assembled to the board 118 (see FIG. 2B). Thus, the guard 136 may provide mechanical attachment between the printed circuit board 118 and the device 100. For instance, in one or more embodiments, an adhesive may be applied to the outer surface 144 of the guard 136 to adhere the guard 136 to the surface 116 of the printed circuit board 118. The attachment provided by the adhesive can be either permanent or temporary. For example, an adhesive may be used to temporarily adhere the guard 136 to the surface 116 of the printed circuit board 118 so that the device 100 is correctly positioned on the printed circuit board 118 during assembly (e.g., during the assembly reflow process). The adhesive may thereafter release and/or be removed, either during or after assembly. In other embodiments, the outer surface 144 of the guard 136 may simply abut the surface 116 of the printed circuit board 118, without adhesive attachment. In such embodiments, some freedom of movement may be permitted between the guard 136 and the surface 116 of the printed circuit board 118.

Figure 6:
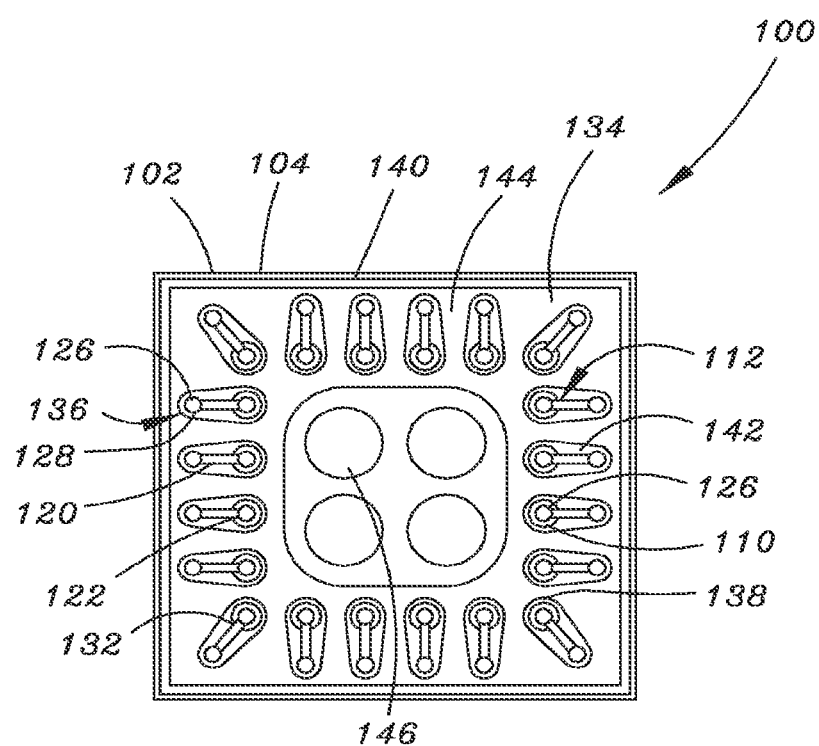
FIG. 6 is a diagrammatic top plan view of the wafer-level packaged device shown in FIG. 4.

In the implementation shown in FIGS. 4 through 6, the device 100 includes one or more attachment bumps 146 formed of a suitable reflowable material (e.g., solder) on the face 134 of the integrated circuit chip 102. During assembly, the high temperature reflow process causes the attachment bumps 146 to melt and reflow. The attachment bumps 146 are then cooled allowing the bumps 146 solidify (e.g., allowing the solder to solidify), securing the device 100 to the printed circuit board 118. The guard 136 does not physically contact the printed circuit board 118 on which the device 100 is mounted.

The attachment bumps 146 are configured to furnish primary mechanical attachment of the device 100 to the printed circuit board 118, while the resilient leads 112 provide primary electrical connection. However, in some instances, the attachment bumps 146 may also furnish electrical connection between the device 100 and the printed circuit board 118, such as to provide power or ground to the device 100, and so on. In such embodiments, the attachment bumps 146 may be interconnected with respective bonding pads 110 of the integrated circuit 106 either directly or via a redistribution structure. The attachment bumps 146 may include under bump metallization (UBM) 148 to provide a reliable interconnect interface. Example procedures for forming the attachment bumps 146 using wafer-level packaging techniques are described in more detail below.

Resilient leads 112 may be arranged on the surface 108 of the integrated circuit chip 102 in a variety of ways. The resilient leads 112 are positioned and oriented to align the lead members 120, so that the lead members 120 can flex to absorb stresses caused by CTE mismatch and dynamic deformation. Thus, it is contemplated that the positioning and orientation of the resilient leads 112 (and attachment bumps 146) may vary due to factors such as the size and shape of the integrated circuit chip 102, the design of the integrated circuit 106 formed on the chip 102, thermal cycling and drop testing requirements, and so on. FIGS. 3 and 6 illustrate example arrangements of resilient leads 112 and attachment bumps 146 of the devices 100 shown in FIGS. 1 and 4, respectively. In FIG. 3, the resilient leads 112 are arrayed about the perimeter of the integrated circuit chip 102. In FIG. 4, attachment bumps 146 used to attach the device 100 to the printed circuit board 118 are positioned centrally on the integrated circuit chip 102 so that the attachment bumps 146 encounter less stress during thermal cycling and drop testing. The resilient leads 112 are arrayed about the perimeter of the integrated circuit chip 102, where higher stresses may be generated, so that the resilient leads 112 encircle the attachment bumps 146. Other arrangements are possible.

Example Fabrication Processes

Figure 7:
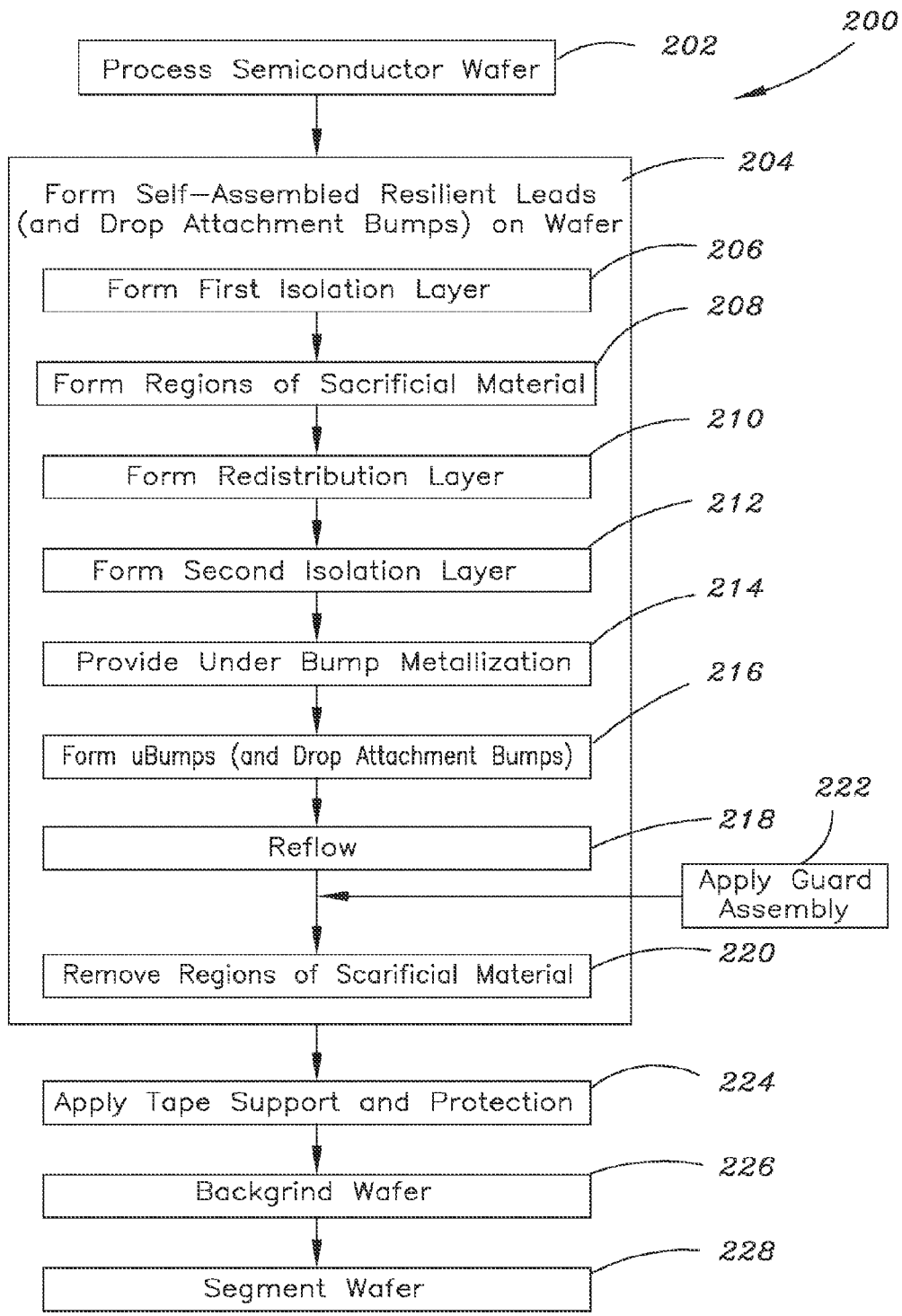
FIG. 7 is a flow diagram illustrating a process in an example implementation for fabricating wafer-level packaged devices having self-assembled resilient leads, such as the devices shown in FIGS. 1 and 4.

FIG. 7 illustrates an example process 200 that employs wafer-level packaging techniques to fabricate semiconductor devices having self-assembled resilient leads, such as the devices 100 shown in FIGS. 1 through 6. In the process 200 illustrated, a semiconductor wafer is processed (Block 202) to create integrated circuits in the surface of the wafer using microlithography techniques. A portion of a wafer 300 is illustrated in FIGS. 8A through 8J and 9A through 9J. As shown, the wafer 300, when processed, includes a substrate 302 having one or more integrated circuits 304 formed in a surface 306 of the substrate 302. The substrate 302 is configured to be segmented (diced) into a plurality of integrated circuit chips 308. In the implementation illustrated, the substrate 302 is silicon. However, it is contemplated that the substrate 302 may instead be fabricated of other semiconductor materials such as germanium, gallium arsenide, silicon carbide, and so forth.

Figure 8A:
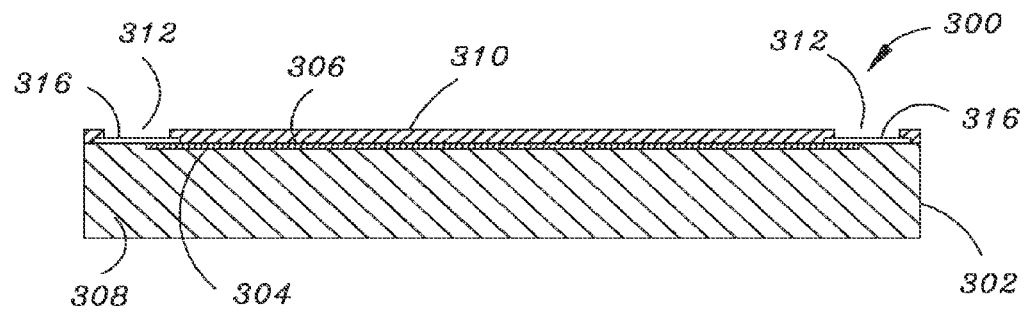
FIGS. 8A through 8J are diagrammatic partial cross-sectional side elevation views illustrating the fabrication of a wafer-level packaged device having self-assembled resilient leads, such as the device shown in FIG. 1, in accordance with the process shown in FIG. 7.
Figures 9A, 9B, 9C, 9D:
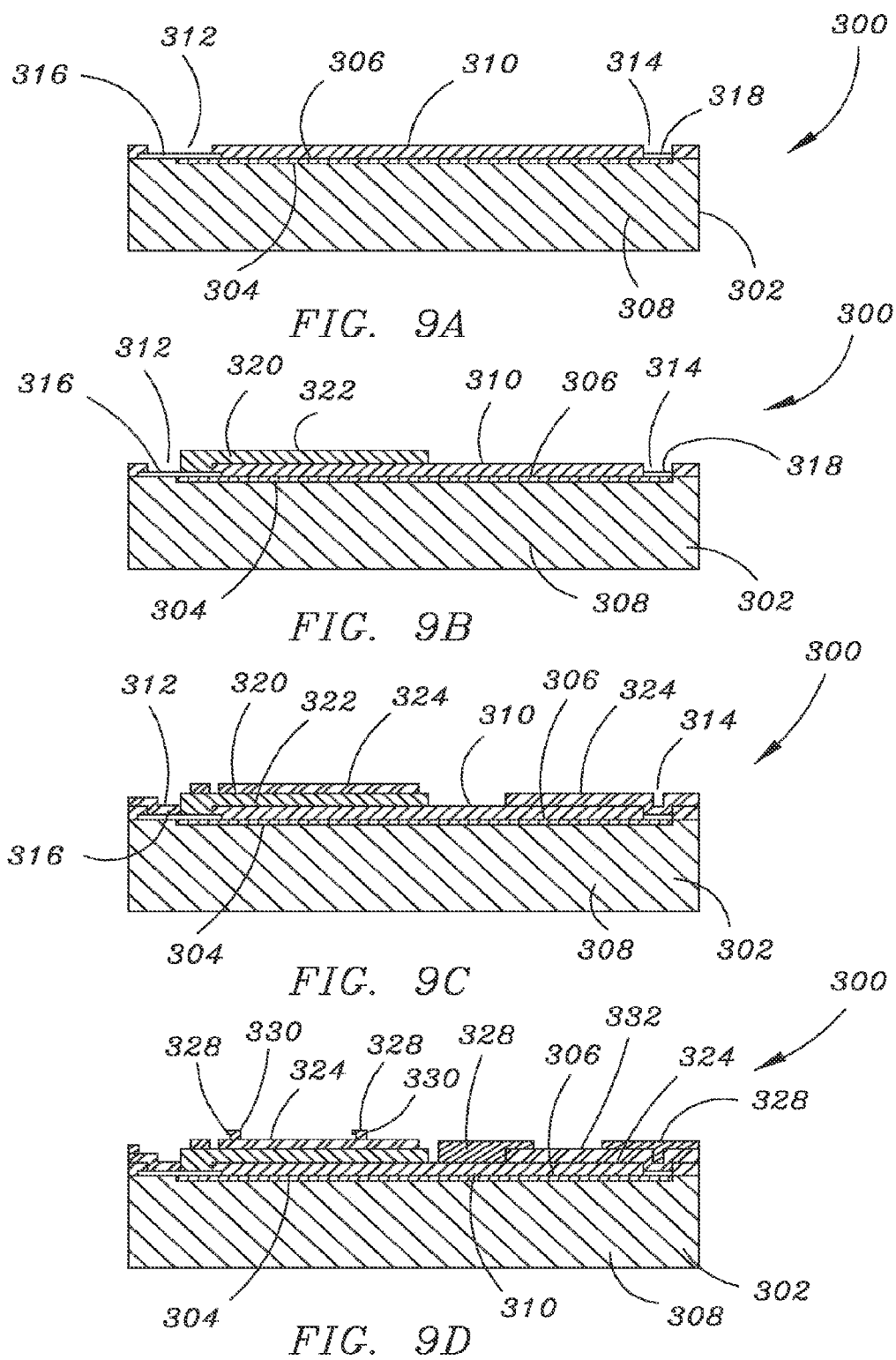
FIGS. 9A through 9J are diagrammatic partial cross-sectional side elevation views illustrating the fabrication of a wafer-level packaged device having self-assembled resilient leads and attachment bumps, such as the device shown in FIG. 4, in accordance with the process shown in FIG. 7.

Self-assembled resilient leads are then fabricated on the wafer (Block 204) in accordance with the present disclosure. As shown in FIG. 7, a first isolation layer is formed (Block 206) on the surface of the wafer over the integrated circuits to isolate the integrated circuits from subsequent conductive layers. FIGS. 8A and 9A illustrate the first isolation layer 310. As shown, apertures 312, 314 are provided in the first isolation layer 310 to expose bonding pads 316, 318 formed on the surface 306 of the substrate 302. In on or more embodiments, the first isolation layer 310 is comprised of a dielectric material such as a benzocyclobutene polymer (BCB), silicon dioxide ($SiO_2$), or the like.

Figure 8B:
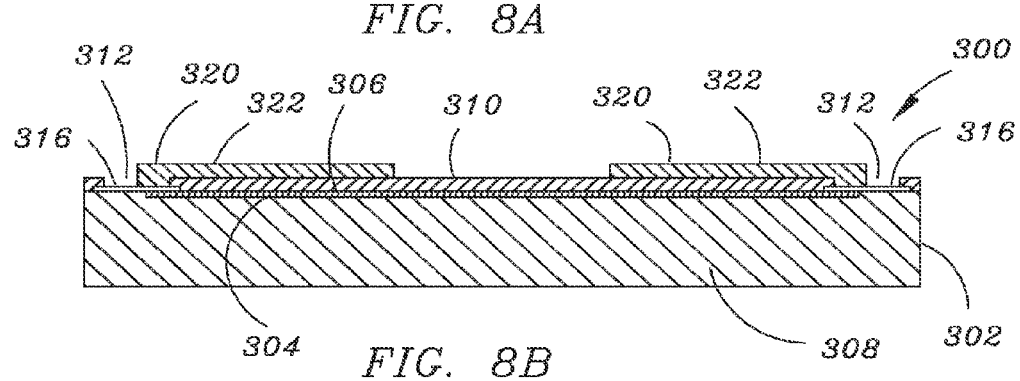

Next, regions of sacrificial material are formed over the first isolation layer (Block 208). As shown in FIGS. 8B and 9B, the regions 320 of sacrificial material 322 may be patterned to have at least the approximate shape (e.g., length, width, outline, etc.) of the resilient leads being formed. The sacrificial material 322 may extend through the apertures 312 formed in the first isolation layer 310 onto the bonding pads 316 of the integrated circuits 304 formed in the surface 306 of the substrate 302 so that the bonding pads 316 are partially covered with the sacrificial material 322. It is contemplated that the regions 320 of sacrificial material 322 may be formed using a variety of materials and processes. For example, materials that may be used as sacrificial materials 322 include, but are not limited to: silicon dioxide ($SiO_2$), aluminum (Al), or high temperature photoresist. Other materials may also be used.

Figure 8C:
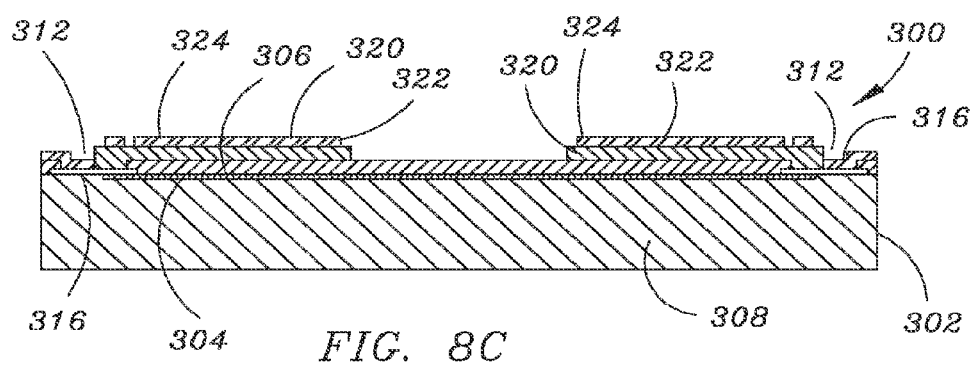

A redistribution layer is then applied over the regions of sacrificial material (Block 210) to provide a redistribution structure on the surface of the wafer. FIGS. 8C and 9C illustrate the redistribution layer 324. As shown, the redistribution layer 324 extends into the apertures 312, 314 formed in the first isolation layer 310 and onto the portions of the bonding pads 316, 318 not covered with sacrificial material 322. The redistribution layer 324 thus forms a base layer 326 of the lead member that is in electrical contact with the bonding pads 316 (see FIGS. 8J and 9J). In FIG. 9C, the redistribution layer 324 is further patterned to extend over at least part of the first isolation layer 310 to form a redistribution structure configured to receive one or more attachment bumps.

The redistribution layer 324 is formed of a conductive material using an appropriate application process. For example, materials that may be used to form the redistribution layer 324 include polysilicon, which may be deposited using chemical vapor deposition (CVD), metals such as aluminum or copper, applied using metallization techniques, and so on. Other materials and/or processes may also be used.

Figure 8D:
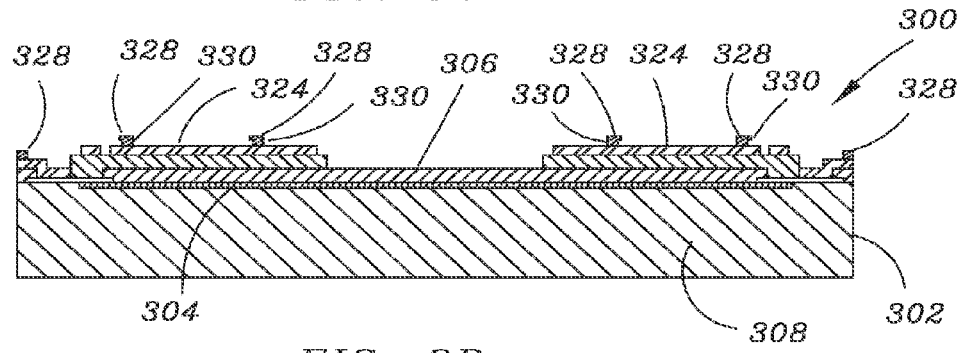

Next, a second isolation layer is applied over the redistribution layer and the first isolation layer (Block 212). FIGS. 8D and 9D illustrate the second isolation layer 328. Like the first isolation layer 310, the second isolation layer 328 is formed of a dielectric material such as a benzocyclobutene polymer (BCB), silicon dioxide ($SiO_2$), or the like. As shown, the second isolation layer 328 may be patterned to form pockets 330 of dielectric material on the redistribution layer 324. In FIG. 9D, the second isolation layer 328 is applied over at least part of the first isolation layer 310 and may have openings 332 formed therein.

Figure 8E:
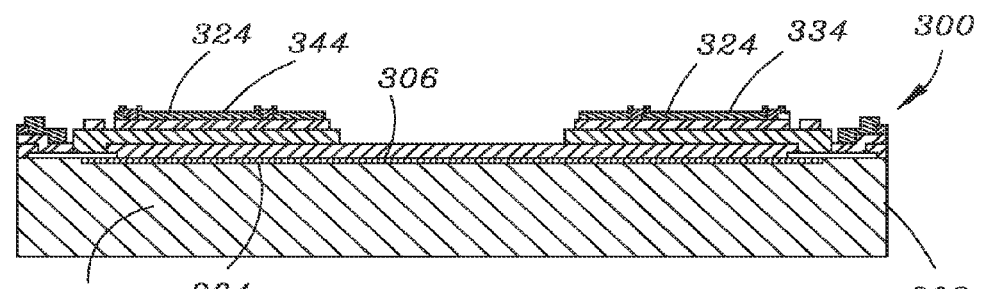
Figure 9E:
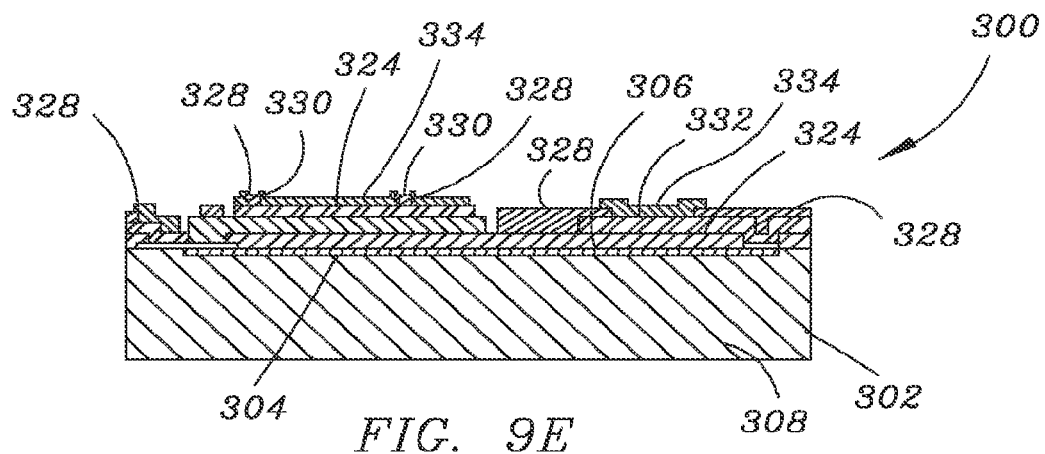

Under bump metallization (UBM) is then provided over the redistribution layer (Block 214). As shown in FIGS. 8E and 9E, the under bump metallization 334 may substantially cover the base layer 326 formed by the redistribution layer 324 adjacent to the pockets 330 of dielectric material. In FIG. 9E, under bump metallization may further be provided over the redistribution layer 324 through the openings 332 formed through the second isolation layer 328. In one or more embodiments, the under bump metallization 334 may be shaped to compensate for the cantilever (e.g., pivoting) action of the lead member (see, e.g., FIGS. 2A and 2B and 5A and 5B).

In one or more embodiments, the under bump metallization 334 may include multiple layers of different metals that function as an adhesion layer, a diffusion barrier layer, a solderable layer, an oxidation barrier layer, and so forth. The under bump metallization layers may be vacuum deposited by evaporation or sputtering, or may be chemically plated.

Figure 8F:
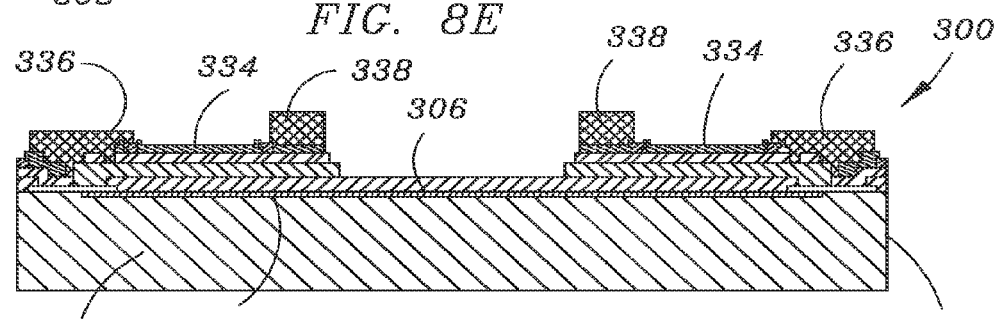
Figure 9F:
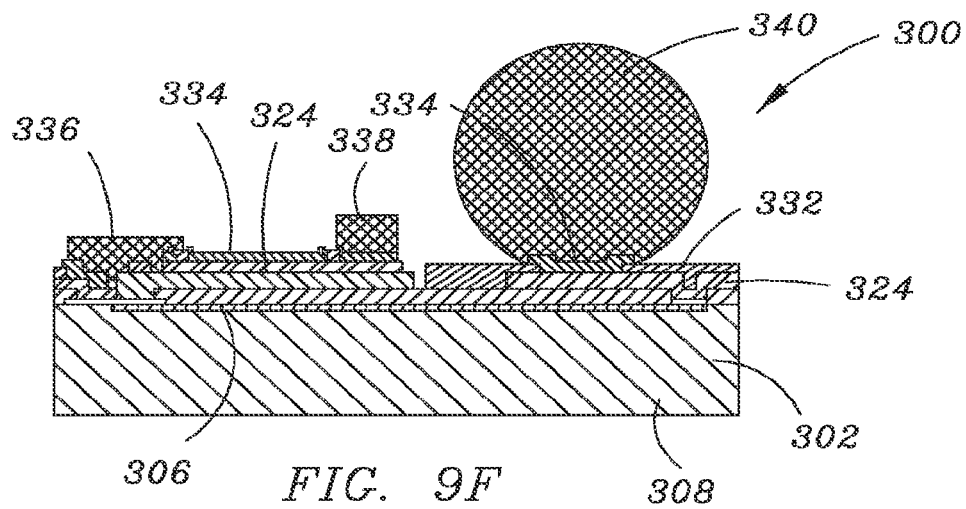

Next, μbumps are formed (Block 216). FIGS. 8F and 9F illustrate formation of first and second μbumps 336, 338 over the under bump metallization 334. In one or more embodiments, the μbumps 336, 338 may be formed of solder applied using an electroplating process. However, it is contemplated that the μbumps 336, 338 may be formed of other conductive substances such as metals (e.g., aluminum) that will melt and flow at temperatures encountered during a high temperature reflow process at assembly (e.g., approximately 220 C). Additionally, it is contemplated that processes other than electroplating may be used to form the μbumps 336, 338 on the under bump metallization 334.

Attachment bumps may further be dropped (Blocks 204, 216) on the wafer. For example, FIG. 9F illustrates attachment bumps 340, formed of solder, dropped onto the under bump metallization 334 applied over the redistribution layer 324 through the openings 332 formed through the second isolation layer 328.

Figure 8G:
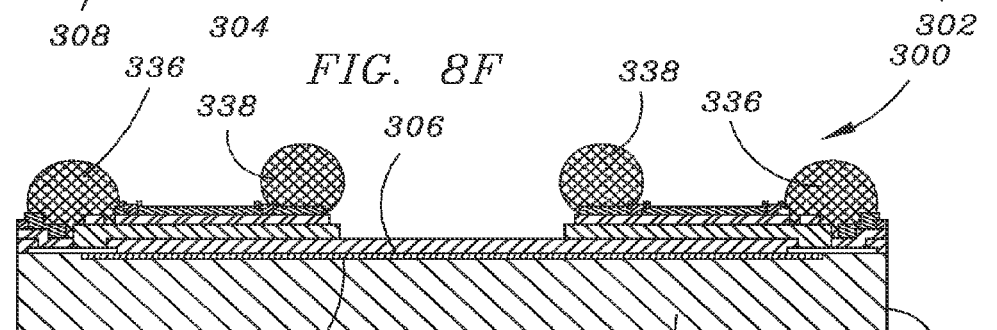
Figure 9G:
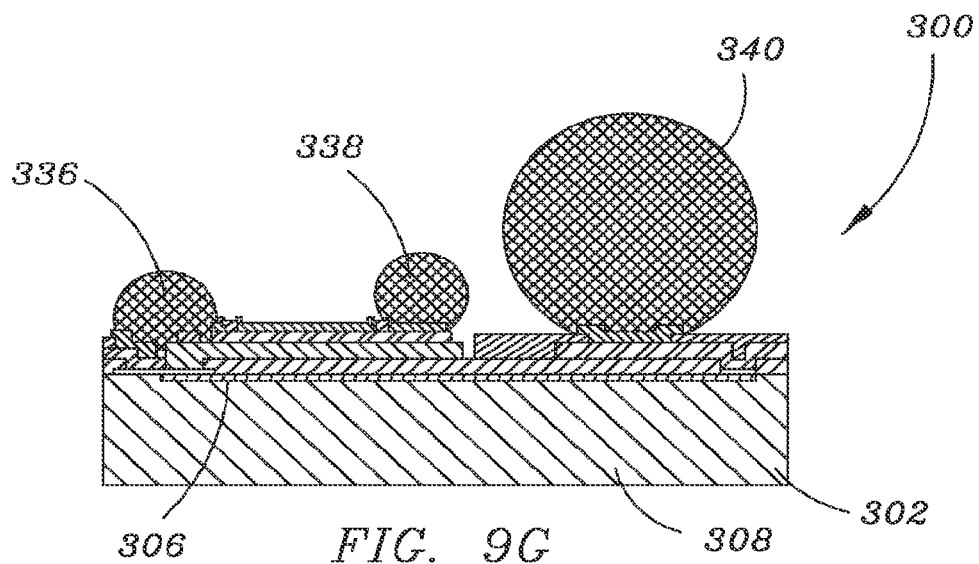

The μbumps (and attachment bumps) are then reflowed (Block 218) to strengthen the attachment between the μbumps (and bumps) and the underlying under bump metallization. FIGS. 8G and 9G illustrate the first and second μbumps 336, 338 (and attachment bumps 340) following reflow. In example implementations, the μbumps 336, 338 may have a diameter on the order of about 50 μm following reflow, while the attachment bumps 340 may have diameter on the order of about 300 μm following reflow. However, μbumps 336, 338 having diameters of greater than or less than 50 μm and/or attachment bumps 340 having diameters of greater than or less than 300 μm are possible.

Figure 8H:
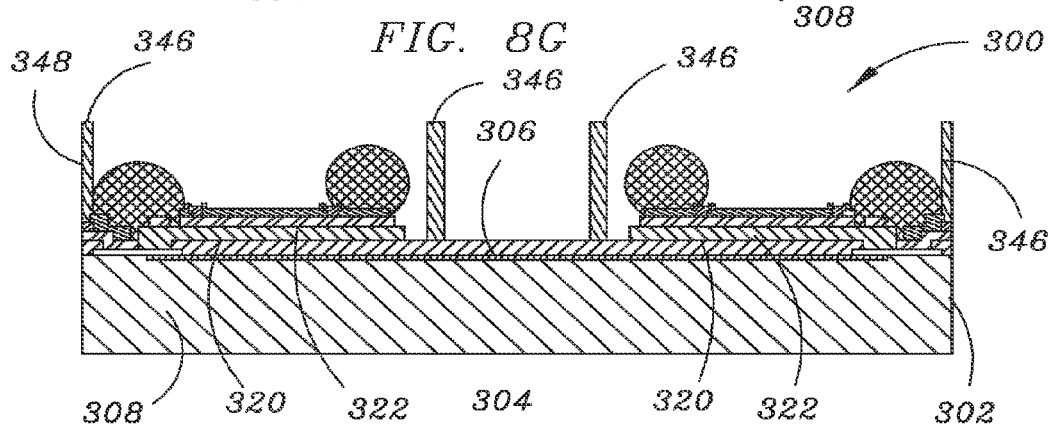
Figure 8I:
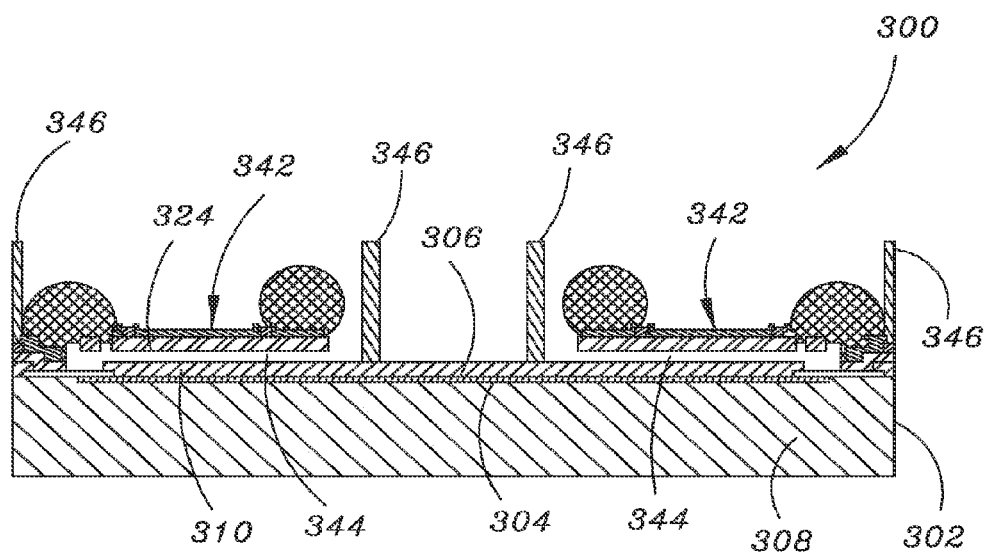
Figure 8J:
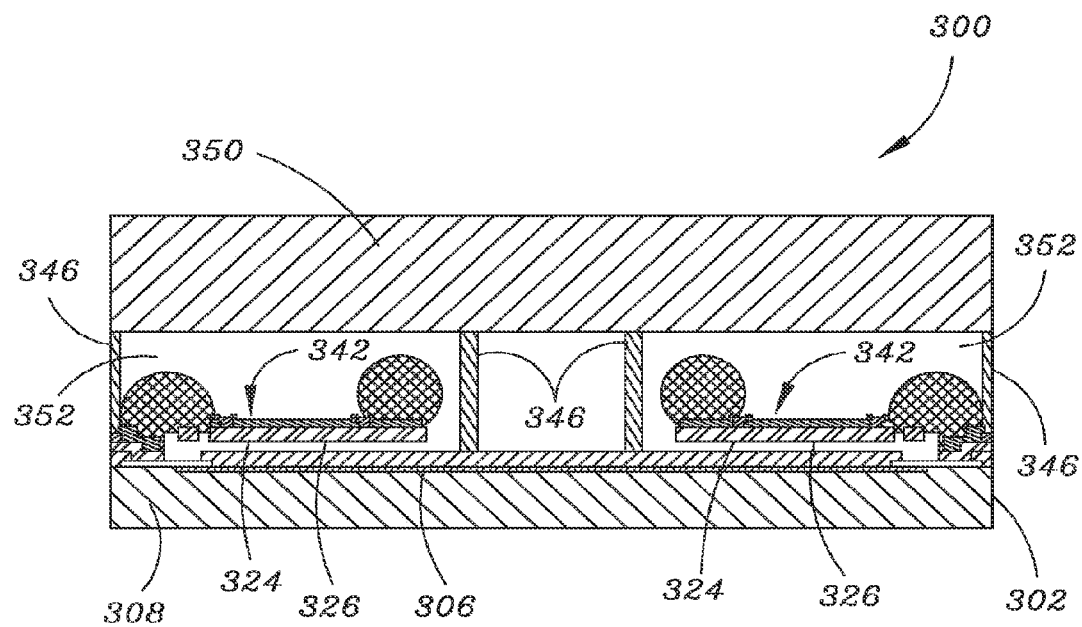
Figure 9H:
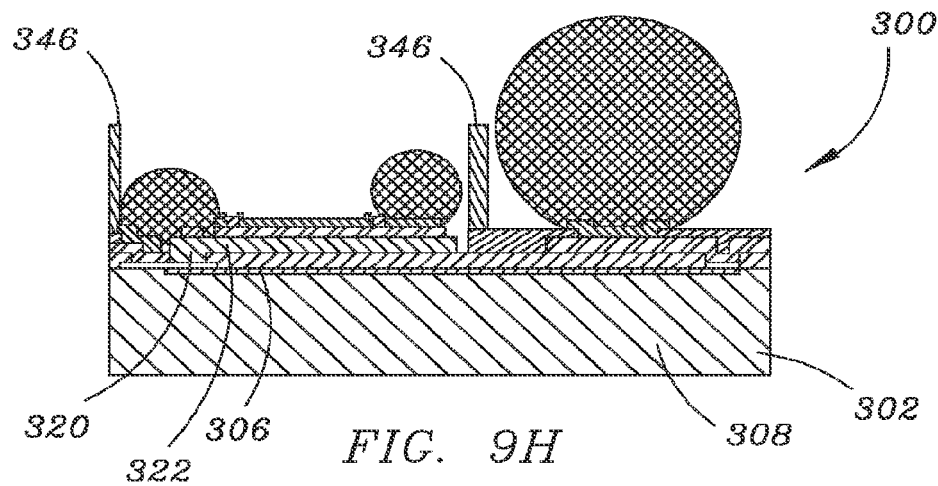
Figure 9I:
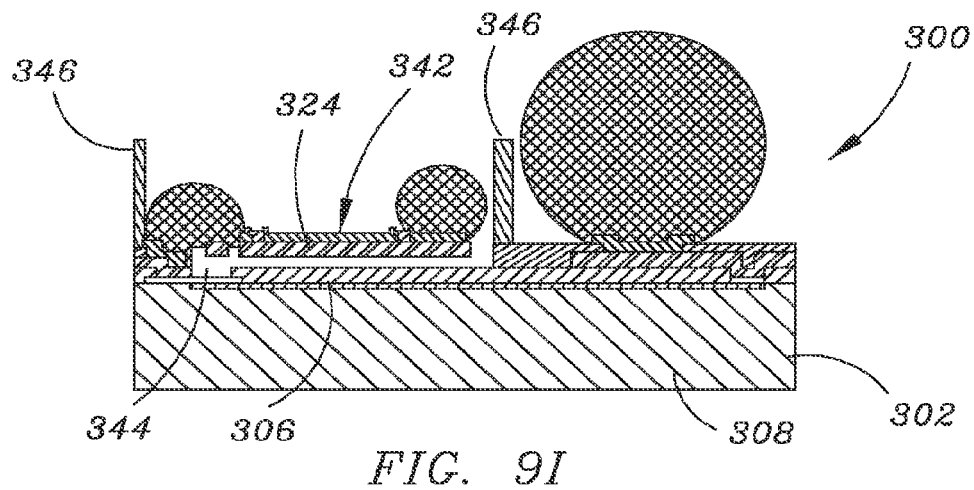
Figure 9J:
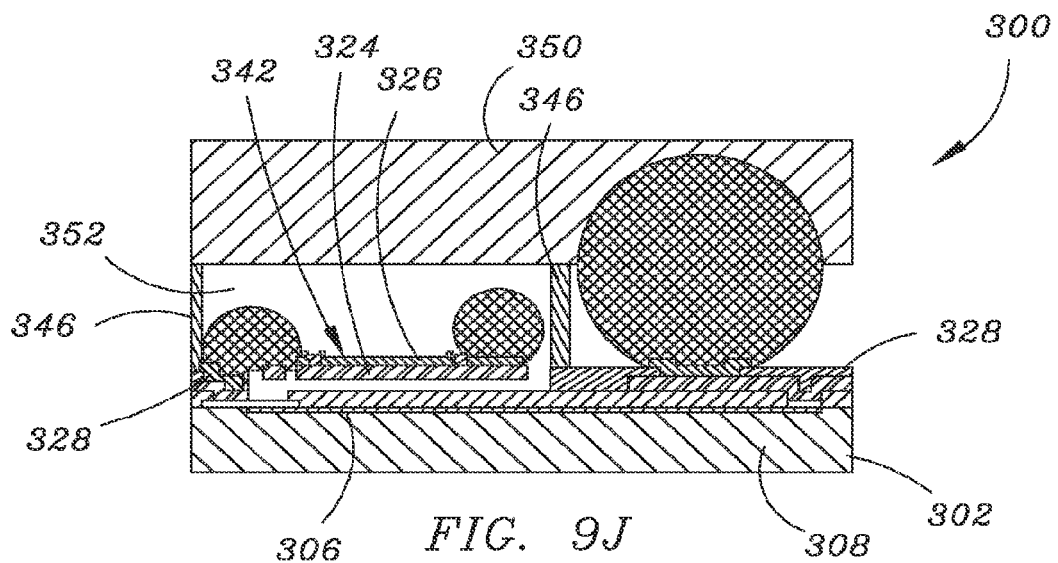

The regions of sacrificial material may now be removed (Block 220) to form the completed resilient leads. FIGS. 8I and 9I illustrate the resilient leads 342 following removal of the regions 320 of sacrificial material 322. As shown, the removal of the sacrificial material 322 creates a void 344 between the redistribution layer 324 and the first isolation layer 310 so that the redistribution layer 324 is generally cantilevered over the first isolation layer 310. In embodiments where the sacrificial material 322 is silicon dioxide, a wet etching process may be used to remove the material 322, while in embodiments wherein the sacrificial material is aluminum, a diluted sodium hydroxide (NaOH) release etch may be used to remove the material 322. Other removal processes are contemplated.

A guard is applied to the wafer (Block 222) to protect the resilient leads 342. As shown in FIGS. 8H and 9H, the guard 346 may be fabricated of a thick polymer layer 348 applied over the second isolation layer 328. In one or more embodiments, the polymer layer 348 is applied as a thick polymer dry film adhered to the second isolation layer 328. In other embodiments, the polymer layer 348 may be applied using spin coating techniques. In embodiments, the guard is applied (Block 224) prior to removal of the regions of sacrificial material (Block 222) so that the sacrificial material remains present to support to the resilient leads during application of the polymer layer. However, it is contemplated that the guard may also be applied (Block 224) after removal of the sacrificial material (Block 222).

Tape support and protection may be applied to the guard (Block 226), enclosing the resilient leads within the guard 346, so that the wafer may then be thinned using a backgrinding process (Block 228) and segmented (e.g., diced) to separate the individual wafer-level packaged devices (Block 228). FIGS. 8I and 9I illustrate the application of backgrind tape 350 over the guard 346. However, it is contemplated that other tapes may be applied. In FIGS. 8I and 9I, the wafer 300 is further illustrated as having been thinned following a backgrinding process and diced using a segmentation process. As shown, the backgrind tape 350 and guard 346 form a pocket 352 that encloses the resilient leads 342 during backgrinding and singulation of the wafer 300. In this manner, exposure of the resilient leads 342 to water and other contaminants that could damage them is prevented. As shown in FIG. 9I, the backgrind tape 350 may further extend over attachment bumps 340 formed on the wafer 300 to protect the bumps 340 during the fabrication process (e.g., backgrinding and segmentation).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A process comprising:
    forming resilient leads on a wafer configured to be segmented into integrated circuit chips;
    applying a guard to the wafer, the guard configured to protect the resilient leads; and
    segmenting the wafer to separate an integrated circuit chip from the wafer, the integrated circuit chip including at least one resilient lead, wherein the at least one resilient lead is configured to move from a first position to a second position during an assembly reflow process, the resilient lead being held adjacent to the integrated circuit chip in the first position and extending away from the integrated circuit chip in the second position to provide electrical interconnection of the integrated circuit chip to a printed circuit board;
    wherein the forming of resilient leads on the wafer comprises:
    applying a first isolation layer onto the wafer, the first isolation layer having apertures formed therein over bonding pads disposed on the wafer;
    forming regions of a sacrificial material over the first isolation layer; applying a redistribution layer over the regions of sacrificial material, the redistribution layer at least partially extending into the apertures formed in the first isolation layer to provide electrical contact with the bonding pads;
    applying a second isolation layer over the redistribution layer and the first isolation layer;
    providing under bump metallization over the redistribution layer;
    forming μbumps over the under bump metallization; and
    removing the regions of sacrificial material so that the redistribution layer applied over the regions of sacrificial material is generally cantilevered over the first isolation layer.

2. The process as recited in claim 1, further comprising applying attachment bumps to the wafer, the integrated circuit chip including at least one attachment bump, wherein the at least one attachment bump is configured to attach the integrated circuit chip to the printed circuit board.

3. The process as recited in claim 2, further comprising:
    applying the redistribution layer over at least part of the first isolation layer;
    applying the second isolation layer over the redistribution layer where the redistribution layer is applied over the first isolation layer, the second isolation layer having openings formed there through to the redistribution layer;
    providing under bump metallization over the redistribution layer through the openings formed through the second isolation layer; and
    dropping the attachment bumps over the under bump metallization.

4. The process as recited in claim 2, wherein the guard comprises dry film polymer, and wherein the guard is applied to the wafer by adhering the dry film polymer over the second isolation layer.

5. The process as recited in claim 2, wherein the guard comprises a polymer, and wherein the guard is applied to the wafer by spin coating the polymer onto the second isolation layer.

6. The process as recited in claim 1, further comprising affixing backgrind tape over the guard prior to dicing of the wafer, the guard and the backgrind cooperating to enclose the resilient leads during dicing of the wafer.

7. The process as recited in claim 6, further comprising backgrinding the wafer following application of the backgrind tape.

\* \* \* \* \*